US008088694B2

(12) United States Patent
Trott

(10) Patent No.: US 8,088,694 B2
(45) Date of Patent: Jan. 3, 2012

(54) METHOD FOR FORMING A MULTIPLE LAYER PASSIVATION FILM AND A DEVICE INCORPORATING THE SAME

(75) Inventor: Gary R. Trott, San Mateo, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1021 days.

(21) Appl. No.: 11/857,288

(22) Filed: Sep. 18, 2007

(65) Prior Publication Data

US 2009/0137130 A1 May 28, 2009

Related U.S. Application Data

(62) Division of application No. 11/085,299, filed on Mar. 21, 2005, now Pat. No. 7,361,930.

(51) Int. Cl.
*H01L 21/318* (2006.01)
*H01L 35/22* (2006.01)
(52) U.S. Cl. ............... 438/791; 438/775; 438/931
(58) Field of Classification Search .................. None
See application file for complete search history.

(56) References Cited

U.S. PATENT DOCUMENTS

| 4,396,443 | A | 8/1983 | Lewerenz et al. |
|---|---|---|---|
| 4,572,881 | A | 2/1986 | Yamazaki |
| 5,140,397 | A | 8/1992 | Haga et al. |
| 5,204,272 | A | 4/1993 | Guha et al. |
| 5,288,989 | A | 2/1994 | Ishaque et al. |
| 5,507,881 | A | 4/1996 | Sichanugrist et al. |
| 5,880,489 | A | 3/1999 | Funaba et al. |
| 6,383,929 | B1 | 5/2002 | Boettcher et al. |
| 6,444,568 | B1 | 9/2002 | Sundararajan et al. |
| 6,593,653 | B2 | 7/2003 | Sundararajan et al. |
| 6,657,284 | B1 * | 12/2003 | Li et al. .................... 257/649 |
| 6,670,705 | B1 | 12/2003 | Harris et al. |
| 6,690,079 | B2 | 2/2004 | Fujimura et al. |
| 6,690,091 | B1 | 2/2004 | Chooi et al. |
| 6,784,512 | B2 | 8/2004 | Yamaguchi et al. |
| 2005/0009320 | A1 | 1/2005 | Goundar |
| 2006/0174935 | A1 | 8/2006 | Sawada et al. |

FOREIGN PATENT DOCUMENTS

JP 2004-277882 10/2004

OTHER PUBLICATIONS

International Searching Authroity, Patent Cooperation Treaty, International Search Report, Sep. 5, 2007.
Andre, J.P. at al., "Low Dark Current and Low Capacitance InGaAs PIN Photodiode Grown by MOVPE", *IOOC-ECOC 85, 5th International Conference on Integrated Optics* 1985, 250-252.
Bauer, Josef G. et al., "Long-Term Operation of Planar InGaAs/InP p-i-n. Photodiodes", *IEEE Transactions on Electron Devices*; vol. 35, No. 12 Dec. 1988, 2349-2354.

(Continued)

*Primary Examiner* — Zandra Smith
*Assistant Examiner* — Pamela E Perkins

(57) ABSTRACT

A method of forming a multiple layer passivation film on a semiconductor device surface comprises placing a semiconductor device in a chemical vapor deposition reactor, introducing a nitrogen source into the reactor, introducing a carbon source into the reactor, depositing a layer of carbon nitrogen on the semiconductor device surface, introducing a silicon source into the reactor after the carbon source, and depositing a layer of silicon carbon nitrogen on the carbon nitrogen layer. A semiconductor device incorporating the multiple layer passivation film is also described.

20 Claims, 5 Drawing Sheets

OTHER PUBLICATIONS

Capasso, F. et al., "A Proposed Hydrogenation/Nitridization Passivation Mechanism for GaAs and Other III-V Semiconductor Devices, Including InGaAs Long Wavelength Photodetectors", *Solid State Science and Technology*, vol. 129, No. 4 Apr. 1982, 821-824.

Chen, P.C. et al., "Laser Diode Chip and Packaging Technology", *SPIE—The International Society for Optical Engineering*; vol. 2610; 25-26 Oct. 1995, 117-126.

Entstrom, R.E. et al., "Passivation of III-V Compounds in Device Structures", *Conference Proceedings—The Northwest Regional Meeting of Metallurgical Society; Murray Hill, NJ* May 1-2, 1986, 439-454.

Hasegawa, H. et al., "Compound Semiconductor Surface Passivation and Novel Device Processing", *Materials Research Society Symposium*; vol. 573 Apr. 5-7 1999, 227-238.

Huang, Rong-Ting , "Improvement in Dark Current Characteristics and Long-Term Stability of Mesa InGaAs/InP p-i-n Photodiodes with Two-Step SiNx Surface Passivation", *IEEE Photonics Technology Letters*; vol. 3, No. 10 Oct. 1991, 934-936.

Li, Xiawei et al., "High-Saturation-Current InP-InGaAs Photodiode with Partially Depleted Absorber", *IEEE Photonics Technology Letters*; vol. 15, No. 9 Sep. 2003, 1276-1278.

Martinelli, Ramon U., "Reliability of Planar InGaAs/InP Photodiodes Passivated with Boro-PhosphoSilicate Glass", *Journal of Applied Physics*; vol. 63, No. 1 Jan. 1988, 250-252.

Sloan, Susan R. , "Processing and Passivation Techniques for Fabrication of High-Speed InP/InGaAs/InP Mesa Photodetectors", *Hewlett-Packard Journal* Oct. 1989, 69-75.

Wu, Binhe et al., "Sulphur Passivation of the InGaAsSb/GaSb Photodiodes", *Applied Physics Letters*; vol. 80, No. 7. Feb. 2002, 1303-1305.

Xie, Yong-Gui et al., "Surface Passivation of Epitaxial Multilayer Structures for InP-Based High-Speed Devices by an Ultrathin Silicon Layer", *Electronics and Communications in Japan*; Part 2, vol. 85, No. 10. 2002, 17-28.

* cited by examiner

US 8,088,694 B2

METHOD FOR FORMING A MULTIPLE LAYER PASSIVATION FILM AND A DEVICE INCORPORATING THE SAME

This is a Divisional of application Ser. No. 11/085,299, filed on Mar. 21, 2005 now U.S. Pat. No. 7,361,930, the entire disclosure of which is incorporated herein by reference.

STATEMENT REGARDING FEDERALLY SPONSORED RESEARCH OR DEVELOPMENT

The United States has rights to certain inventions disclosed herein under Defense Advanced Research Projects Agency (DARPA) contract No. MDA972-03-3-0004.

BACKGROUND

Many electronic devices are fabricated by forming layers of material from various elements of the periodic table. For example, electronic devices such as photodetectors and heterojunction bipolar transistors are fabricated using various combinations of what are referred to as III-V semiconductor materials. These devices are typically formed having one or more p-n junctions or having p-type doped material and n-type doped material separated by a layer of intrinsic material. These devices are generally referred to as having a p-i-n junction. For example, in a photodetector, the intrinsic material forms the depletion region where light is converted to electron-hole pairs to generate an electrical signal proportional to the detected light. In some applications, such as in a mesa photodiode or heterojunction bipolar transistor, the intrinsic material or pn junctions are exposed at the device surface. These devices are very sensitive to leakage current in the intrinsic material or at the surfaces of the intrinsic material.

Devices in which the p-n junction is exposed, generally degrade rapidly due to environmental exposure unless they are enclosed in an expensive hermetic package. Examples of environment exposure include elevated temperatures in air during packaging (up to ~300 degrees Celsius) or exposure to humidity during the course of normal operation. To provide environmental protection, a passivation layer is often formed over the exposed p-n junction or intrinsic material to prevent environmental exposure from degrading the performance of the device. Unfortunately, the oxide material that is native to the III-V semiconductor materials is unstable and gives rise to surface defects at the intrinsic layer-oxide interface when a passivation film using the native III-V oxide is formed over the intrinsic material layer. The surface defects formed at the intrinsic layer-oxide interface act as minority carrier recombination sites. The electron-hole pairs recombine at the minority carrier recombination site, thus preventing the electrical signal from flowing through the electrical contacts of the device. Instead, the recombination of the electron-hole pair at the defect site causes a leakage current to flow in the intrinsic material, thus degrading the performance of the device. In an HBT, these defects limit the performance of the transistor by limiting current flow through the junction. In a photodiode the optical response is reduced because the photogenerated electron-hole pairs do not flow through the external circuit.

Although passivation coatings have successfully been used in silicon wafer fabrication processing, the deposition of oxygen, silicon or hydrogen, which are typical components of a passivation film on a type III-V semiconductor material, causes defects to form at the semiconductor-passivation layer interface.

SUMMARY OF THE INVENTION

The invention provides a method of forming a multiple layer passivation film on a semiconductor device surface comprising placing a semiconductor device in a chemical vapor deposition reactor, introducing a nitrogen source into the reactor, introducing a carbon source into the reactor, depositing a layer of carbon nitrogen on the semiconductor device surface, introducing a silicon source into the reactor after the carbon source, and depositing a layer of silicon carbon nitrogen on the carbon nitrogen layer. The method for forming a multiple layer passivation film forms a film that environmentally protects the underlying semiconductor material while minimizing the formation of defects at the semiconductor-passivation layer interface.

The invention also comprises a semiconductor device comprising a substrate, a p-type semiconductor material, an intrinsic semiconductor material, an n-type semiconductor material, metal contacts in electrical contact with the p-type semiconductor material and the n-type semiconductor material, and a multiple layer passivation film over the intrinsic semiconductor material, the multiple layer passivation film comprising silicon, carbon and nitrogen.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Although the embodiments of the method for forming a multiple layer passivation film and device incorporating the same in accordance with the invention will be described in the context of forming a passivation film over an intrinsic semiconductor layer of a mesa photodetector formed using a type III-V semiconductor material system, the method for forming a multiple layer passivation film and device incorporating the same is applicable to other semiconductor material systems and is applicable to transistor devices, such as a heterojunction bipolar transistor (HBT). For example, the method for forming a multiple layer passivation film and device incorporating the same is applicable to devices fabricated using the silicon material system, the germanium material system, the gallium nitride material system, the indium phosphide material system, the gallium arsenide material system, and other material systems.

Figure 1A:
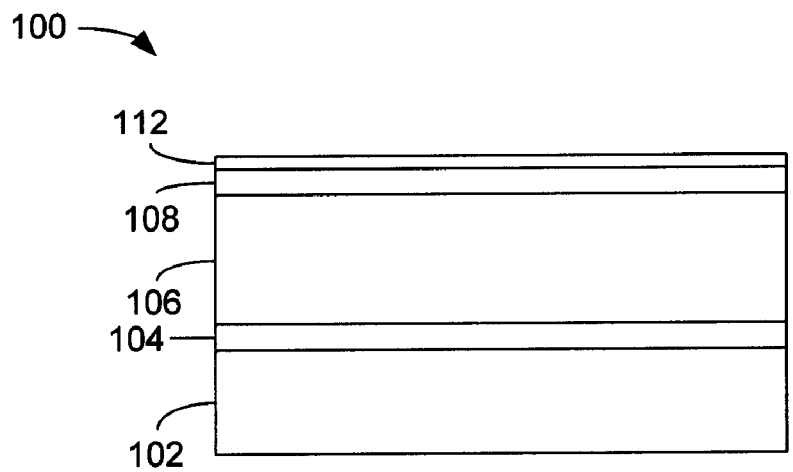
FIGS. 1A, 1B and 1C are schematic diagrams collectively illustrating a simplified type III-V semiconductor photo-sensitive device structure in accordance with the invention.
Figure 1B:
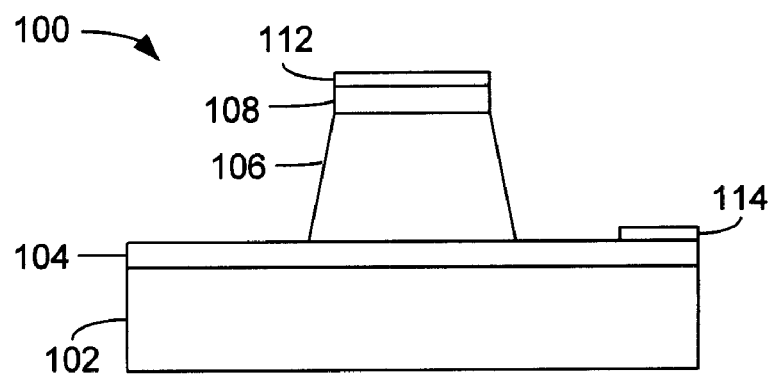
Figure 1C:
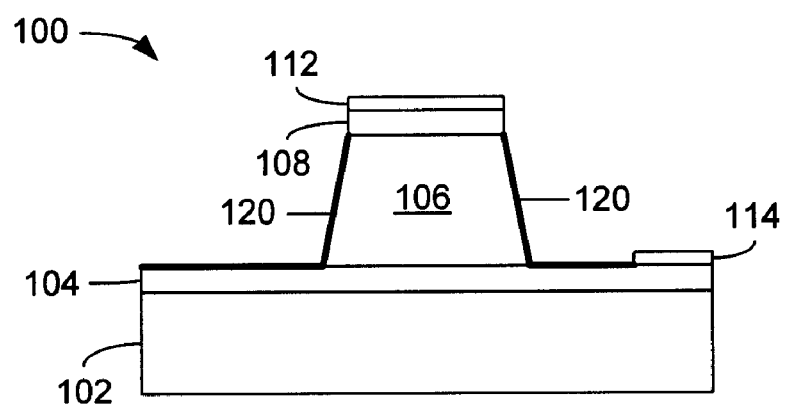

FIGS. 1A, 1B and 1C are schematic diagrams collectively illustrating a simplified type III-V semiconductor photo-sensitive device structure. In this example, the semiconductor device is a photodetector 100. In FIG. 1A, a substrate 102 is formed using iron doped indium phosphide (Fe: InP). A p-type or n-type semiconductor layer 104, in this example, indium gallium arsenide (InGaAs) is formed over the substrate 102. An undoped indium gallium arsenide intrinsic layer 106 is formed over the semiconductor layer 104 and a p-type or n-type semiconductor layer 108 of indium gallium arsenide layer is formed over the intrinsic layer 106. The doping of the semiconductor layer 108 is opposite the doping of the semiconductor layer 104. A contact layer 112 is formed over the layer 108. It should be understood that the device structure shown in FIG. 1A is simplified, in which certain material layers and process steps have been omitted for clarity.

FIG. 1B is a schematic diagram illustrating the photodetector 100 of FIG. 1A after portions of the contact layer 112, semiconductor layer 108 and intrinsic layer 106 have been etched down to the surface of the semiconductor layer 104. An additional contact layer 114 is applied over the layer 104. The structure shown in FIG. 1B is known to those skilled in the art as a "mesa" photodetector device structure.

FIG. 1C is a schematic diagram illustrating the mesa device structure of FIG. 1B. In FIG. 1C, a dielectric multiple layer passivation film 120, is formed over the exposed surfaces of the semiconductor layer 104 and the intrinsic layer 106. The multiple layer passivation film 120 (also referred to hereafter as "passivation film 120"), as will be described below, is formed in such a way as to minimize any defects that may form at the interface of the semiconductor layer 104, the intrinsic layer 106, and the passivation film 120 and provide environmental protection to those layers.

Figure 2:
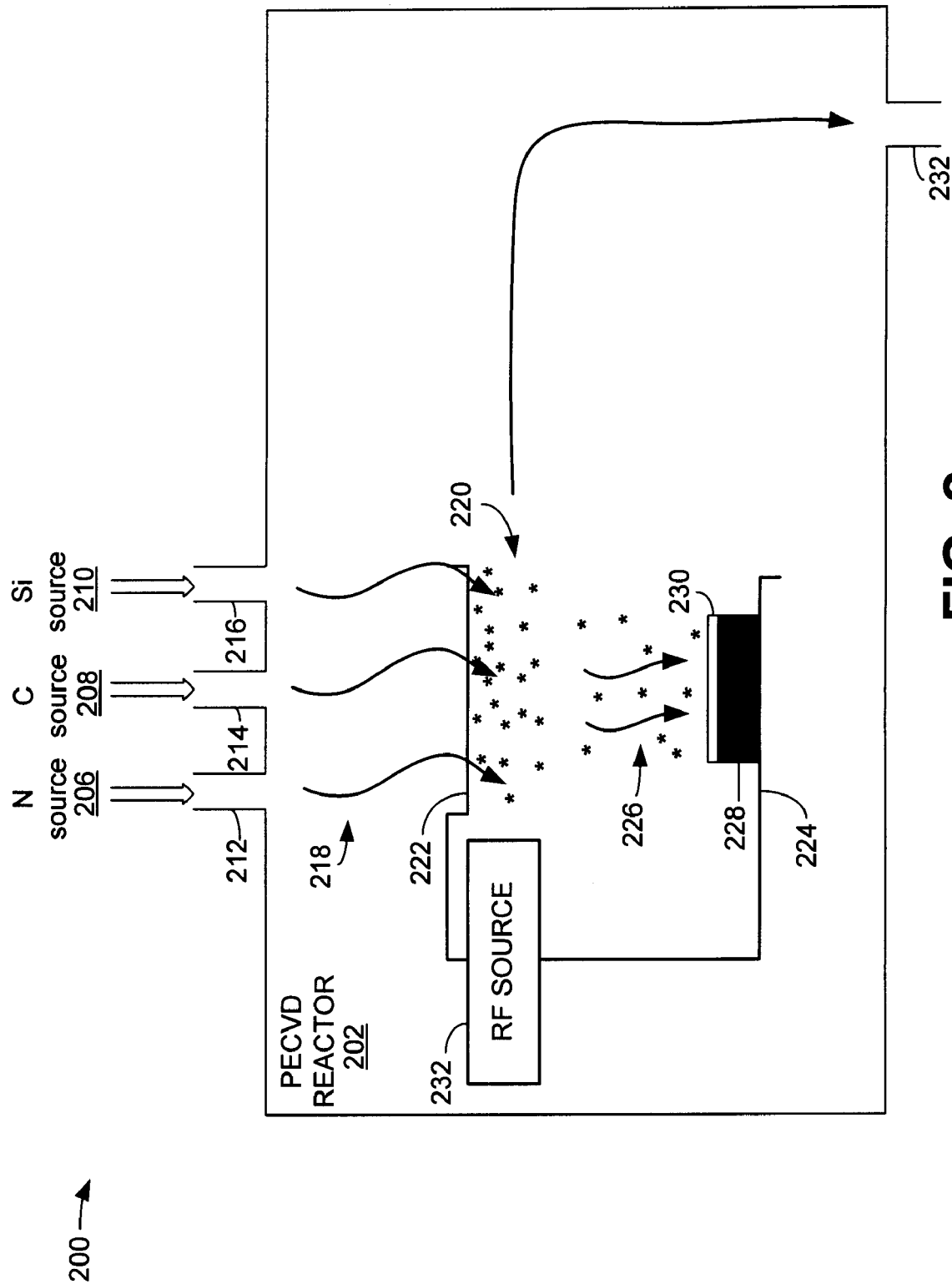
FIG. 2 is a schematic diagram illustrating a plasma enhanced chemical vapor deposition reactor in which the passivation layer can be formed.

FIG. 2 is a schematic diagram 200 illustrating a chemical vapor deposition reactor in which the passivation film 120 can be formed in accordance with the invention. In this example, the chemical vapor deposition reactor is a plasma-enhanced chemical vapor deposition (PECVD) reactor 202. However, other material processing technologies and devices can be used to form the passivation film 120 in accordance with embodiments of the invention. The PECVD reactor 202 includes a plurality of ports 212, 214 and 216 through which elemental sources are introduced to the PECVD reactor 202. For example, a nitrogen source 206 is introduced through port 212, a carbon source 208 is introduced through port 214 and a silicon source 210 is introduced through port 216. The number of sources need not equal the number of ports. A typical nitrogen source is, for example, nitrogen gas ($N_2$) or ammonia ($NH_3$), a typical carbon source is, for example, methane ($CH_4$), and a typical silicon source is, for example, silane ($SiH_4$). The compound sources enter the ports as gasses illustrated using arrows 218. The compound sources flow through the ports 212, 214 and 216 and enter a radio frequency (RF) plasma field 220, where the compounds are energized and release reactive species of constituent elements. For example, the ammonia releases nitrogen ions, the methane releases carbon ions and the silane releases silicon ions.

The RF plasma is generated by an RF source 232, which is coupled to a pair of electrodes 222 and 224. When the RF source 232 is energized, a high energy RF plasma is generated between the electrodes 222 and 224 in the vicinity indicated at 220. As the source compounds enter the RF plasma field 220, reactive species are created, and precipitate away from the plasma field 220 towards the surface of the wafer 228. The reactive species are deposited on the surface of the wafer 228, and form a film 230 as shown. In this example, the film 230 can be the passivation film 120 of FIG. 1C. After deposition, the remaining gasses are exhausted from the PECVD reactor 202 via the exhaust port 232.

One skilled in the art of deposition systems will understand that there are other similar methods to deposit films onto III-V materials where the intent is to minimize the physical damage to the III-V surface. Semiconductor materials fabricated using the III-V material system become progressively more sensitive to degradation if the deposition temperature rises beyond 300 degrees Celsius or if the deposition energy increases. Any kind of remote plasma source or hot wire catalytic system that decomposes the input source gases could be chosen that keeps the wafers at sufficiently low temperatures and low deposition energy for the duration of the deposition. Alternatively, a deposition system using a vacuum load lock chamber can also be used to prevent degradation while loading and unloading the III-V semiconductor wafer. Such a system has process requirements known to those skilled in the art.

There are multiple choices for source gas materials. Common choices for the nitrogen source are nitrogen $N_2$ or ammonia $NH_3$ gas. An alternative for the silicon source includes, for example, disilane or liquid silane sources such as Tretra-Ethyl-Ortho-Silicate (TEOS). There are multiple source materials for the carbon. Alternative sources for carbon include, for example, ethane, butane, propane, or liquid hydrocarbon sources used in a bubbler with nitrogen ($N_2$) as a carrier gas. The source of the carbon may even be contamination present on the walls of the PEVCD reactor 202 or on the surface of the wafer 228, such as carbon in the photoresist. These sources are examples only. It is also possible to use sources that are combinations of nitrogen, carbon and silicon.

It is also possible to use solid sources for the silicon, and carbon. In the case of solid sources a sputtering system or similar method is employed to move the source material into the gas phase for deposition onto the III-V wafer material. For example, a sputtering system may be used with a solid silicon (and/or carbon) source plus a nitrogen source ($N_2$ or $NH_3$) to deposit the multiple layer passivation film 120. In addition, photoresist or other poly-carbon material on the wafer or reactor walls can be transferred to the gas phase and be redeposited on the III-V wafer.

Figure 3:
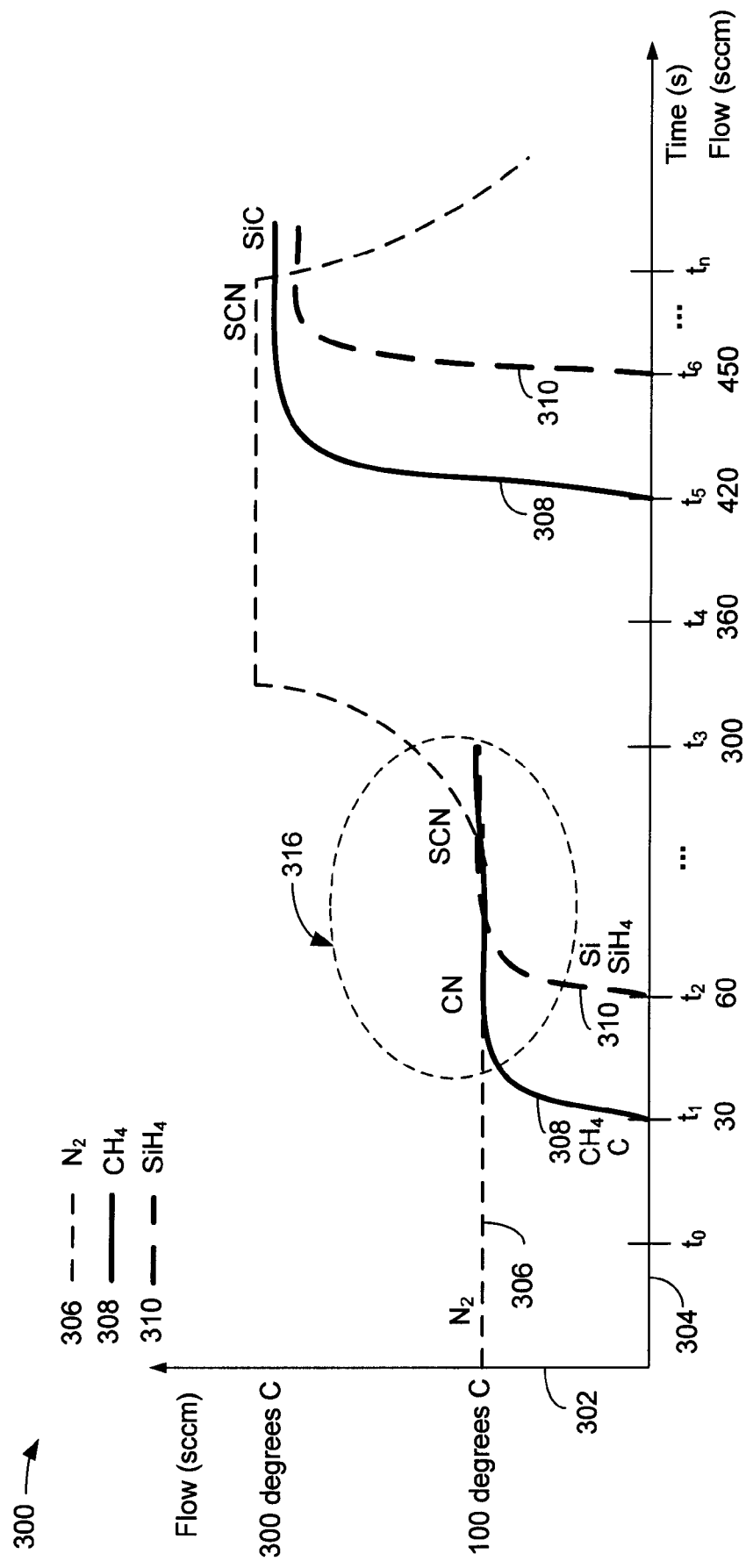
FIG. 3 is a graphical view illustrating a process for growing the passivation layer of FIG. 1C in accordance with the invention.

FIG. 3 is a graphical view 300 illustrating a process for growing the passivation film 120 of FIG. 1C in accordance with the invention. The vertical axis 302 represents the approximate temperature and flow, in degrees Celsius, and at which the PECVD reactor 202 (FIG. 2) is operated, and shows the approximate temperature at which the flow of the sources of nitrogen, carbon and silicon occur. In this example, the two approximate temperatures at which the multiple layer passivation film is deposited are approximately 100 degrees Celsius and approximately 300 degrees Celsius. However, other temperatures are also possible if, for example, a load lock system is available on the reactor. The flow of the compound sources is measured in standard cubic centimeters per minute (sccm) and applies generally to the PECVD reactor 202. Other deposition reactors and methods have source material flow rates that are specific to the particular deposition process and may vary from the flow rates described here.

The horizontal axis 304 represents time in seconds. At a time before to the flow of the nitrogen source 206 (nitrogen gas) is initiated. At a time to, the RF plasma field 220 within the PECVD reactor 202 is energized at the lowest RF energy power of, in this example, about 10 watts (W). In this example, the flow of nitrogen gas ($N_2$) is begun at approximately 100 degrees Celsius at a flow rate of approximately 2000 sccm. The flow of nitrogen gas ($N_2$), indicated using trace 306 is continuous. At time $t_1$, which in this example, is approximately 30 seconds from $t_0$, the flow of the carbon source 208 (methane), indicated using trace 308, is initiated at about 100 degrees Celsius, while the flow of the nitrogen source 206 continues. The flow rate of the carbon source 206 (methane) starts at 0 sccm and is ramped to approximately 210 sccm and stabilized before time $t_2$.

At a later time $t_2$, which in this example in accordance with the invention is approximately 60 seconds from time to, the flow of the silicon source 210 (silane), which is indicated using trace 310, is initiated at 100 degrees Celsius, while the flow of the nitrogen source 206 and the carbon source 208 continues. The flow of the silicon source 210 (silane) at time $t_2$ is 0 sccm and the flow of the silicon source 210 (silane) is ramped to approximately 105 sccm.

In accordance with an embodiment of the invention, only the nitrogen source 206 is operating when the plasma is initiated. Then, while the nitrogen source continues to flow, the flow of the carbon source 208 (methane) is initiated, beginning a period when an insulating dielectric interfacial layer of carbon and nitrogen (CN) begins to form on the surface of the wafer 228 (FIG. 2). At time $t_2$, the flow of the silicon source 210 (silane) is initiated. The simultaneous flow of the nitrogen 306, carbon 308 and silicon 310 occurs within a time and temperature region 316 that creates an insulating, cover layer of silicon carbon nitrogen (SCN). The layer of CN deposited approximately between times $t_1$ and $t_2$ creates a defect-free interfacial layer covering the surface of the semiconductor. The defect free surface provided by the interfacial layer provides a surface on which to continue to grow additional layers of the multiple layer passivation film 120, including a cover layer of SCN or a layer of another environmentally robust material, not necessarily containing silicon. For example, an aluminum source can be introduced after the carbon and nitrogen. The flow rates of the nitrogen, carbon and silicon sources, the deposition temperature and the RF power levels mentioned above are for example purposes only and are mentioned to illustrate typical deposition conditions. Other flow rates and deposition conditions in accordance with the invention may typically be used.

FIG. 3 describes the preferred embodiment of the invention where the introduction of the carbon source prior to the introduction of the silicon source, occurs after the nitrogen plasma has been initiated. Variations on the order of the introduction of the sources also provide reduction of defects on the semiconductor surface. For example, having the carbon source flowing with the nitrogen source at $t_0$ provides nearly as much benefit as delaying the carbon source flow with respect to the nitrogen source flow. This occurs when the carbon source is contamination on the PECVD chamber wall or photoresist on the semiconductor wafer. Further, if the carbon source is contamination on the PECVD chamber wall or photoresist on the semiconductor wafer, delaying the flow of the silicon source is more beneficial than having the silicon source flowing with the nitrogen source at time $t_0$.

The time and temperature region indicated using reference numeral 316 in FIG. 3 indicates a silicon carbon nitrogen layer being deposited at approximately 100 degrees Celsius and which is approximately 10 to 30 nanometers (nm) thick. The deposition time is approximately 5 minutes.

In accordance with an embodiment of the invention, the flow 308 of the carbon source 208 is initiated before initiating the flow 310 of the silicon source 210. The flow of the carbon source is typically stabilized for at least 5-30 seconds prior to the introduction of the silicon source, providing a period when an insulating dielectric interfacial layer of carbon and nitrogen (CN) forms on the surface of the wafer. The silicon source is typically introduced no later than approximately 3-5 minutes after the carbon source has stabilized, and typically about 15 seconds to 3 minutes after the carbon source has stabilized.

By initiating the flow 308 of the carbon source, prior to the silicon source 310, any defects that might be caused by silicon atoms interacting with the surface of the semiconductor wafer 228 are reduced. Nitrogen and carbon plasmas and associated deposited active atom species thereof that form on the surface of the semiconductor wafer 228 under low power and low temperature conditions typically do not cause significant degradation of the device performance parameters. Therefore, typically no, or negligible, surface damage occurs. Prior carbon films are not environmentally stable. In the deposition of silicon active atom species subsequent to the nitrogen and carbon species, the carbon and nitrogen atoms prevent the silicon atoms from forming defects on the semiconductor surface, while simultaneously allowing the silicon atoms to begin to form a stable film.

After an approximately 200 nanometer thick cover layer of silicon carbon nitrogen (SCN) is deposited at approximately 100 degrees Celsius, at time $t_3$, which in this example is approximately 5 minutes from time $t_0$, the plasma (RF source 232) is switched off and the flow of the carbon source 208 and the silicon source 210 is suspended. At this time the temperature in the PECVD reactor 202 is increased to approximately 300 degrees Celsius, while maintaining the flow of the nitrogen source 206.

After the reactor stabilizes at approximately 300 degrees Celsius and while the nitrogen source 206 continues flowing, the RF plasma source is reinitiated at time $t_4$ and stabilized for approximately 30 seconds. The flow of the carbon source 208 is ramped again to approximately 210 sccm at time $t_5$ and is allowed to stabilize. As described above, at a later time $t_6$, which in this example is approximately 30 seconds from time $t_5$, the flow of the silicon source 210 (silane), which is indicated using trace 310, is ramped again to approximately 105 sccm at 300 degrees Celsius, while the flow of the nitrogen source 206 and the carbon source 208 continues. At a time period $t_n$, the initial semiconductor surface is buried beneath the interfacial layer of CN and subsequent layers of silicon carbon nitrogen film, one deposited at approximately 100 degrees Celsius and another deposited at approximately 300 degrees Celsius. Alternatively, if the semiconductor wafer can be loaded into the PECVD reactor 202 at the higher temperature (in this example, 300 degrees Celsius) without forming defects as a result of the high temperature loading process, then the interfacial layer of CN and the cover layer of SCN can be grown at the higher temperature.

After the deposition of the silicon carbon nitrogen film at approximately 300 degrees Celsius, subsequent RF power levels and source gas flows can be changed to accomplish a second design function of the passivation film. For example, the flow of nitrogen 306 can be suspended, thus forming a layer of silicon carbide over the silicon carbon nitrogen after time $t_n$. Silicon carbide is well known to be an environmentally robust passivation layer. Changing the RF power level and source gas flows to deposit silicon dioxide ($SiO_2$), silicon nitrogen (SiNx) or other films are also possible, depending on the desired design goals.

Figure 4:
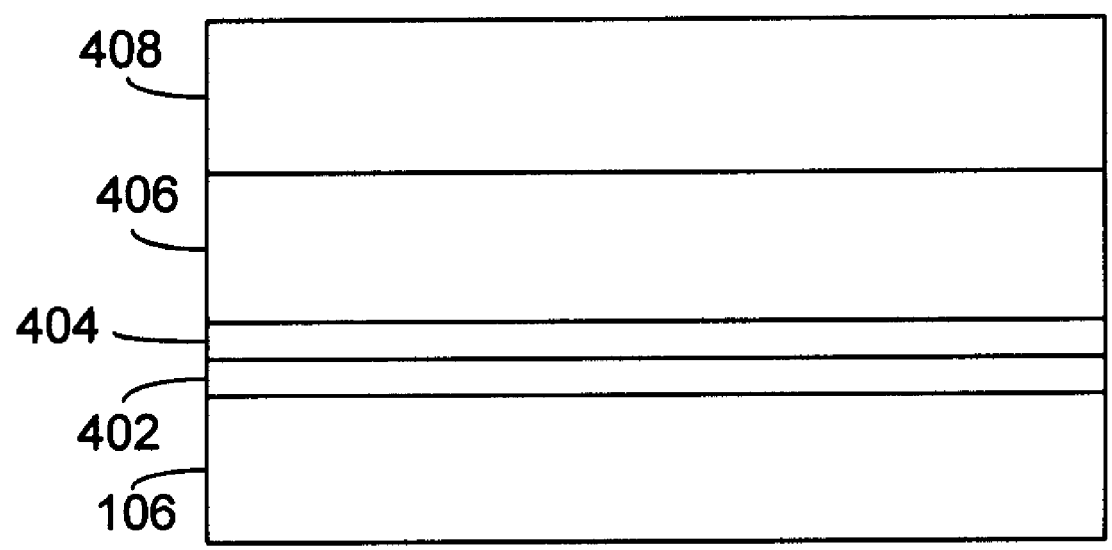
FIG. 4 is a graphical illustration illustrating an embodiment of the passivation layer of FIG. 1C in accordance with the invention.

FIG. 4 is a graphical illustration 400 illustrating an embodiment of the passivation layer 120 of FIG. 1C. The indium gallium arsenide intrinsic layer 106 of FIGS. 1A, 1B and 1C is shown for reference. A carbon nitrogen interfacial layer 402 is formed over the semiconductor 106. The carbon nitrogen interfacial layer 402 is deposited at a time approximately between time $t_1$ and time $t_2$ of FIG. 3 in which only the nitrogen 306 and carbon 308 forms on the surface of the semiconductor 106. A cover layer 404 of silicon carbon nitrogen, approximately 1-20 nanometers thick, and preferably about 20 nanometers thick, is deposited over the carbon nitrogen layer 402. The cover layer 404 is grown at approximately 100 degrees Celsius during the time and temperature region 316 illustrated in FIG. 3, and generally between time periods $t_2$ and $t_3$. In this embodiment, the SCN of layer 404 buries the interfacial layer 402 and forms a cover layer on which to continue growing layers of the passivation film 120. The cover layer 404 is relatively porous when grown at 100 degrees Celsius.

A 100-200 nanometer thick SCN layer 406 is formed over the cover layer 404, and is deposited at a substrate temperature of approximately 300 degrees Celsius, indicated generally between time periods $t_6$ and $t_n$ of FIG. 3. The layer 406, which can be referred to as a high temperature cover layer, is substantially non-porous compared to the layer 404 which is deposited at approximately 100 degrees Celsius. The SCN layer 406 provides superior environmental protection to the intrinsic layer 106 than does the SCN layer 404. An optional approximately 100-200 nanometer thick silicon carbide layer 408, or other material film, can be grown over the layer 406, as described above.

Figure 5:
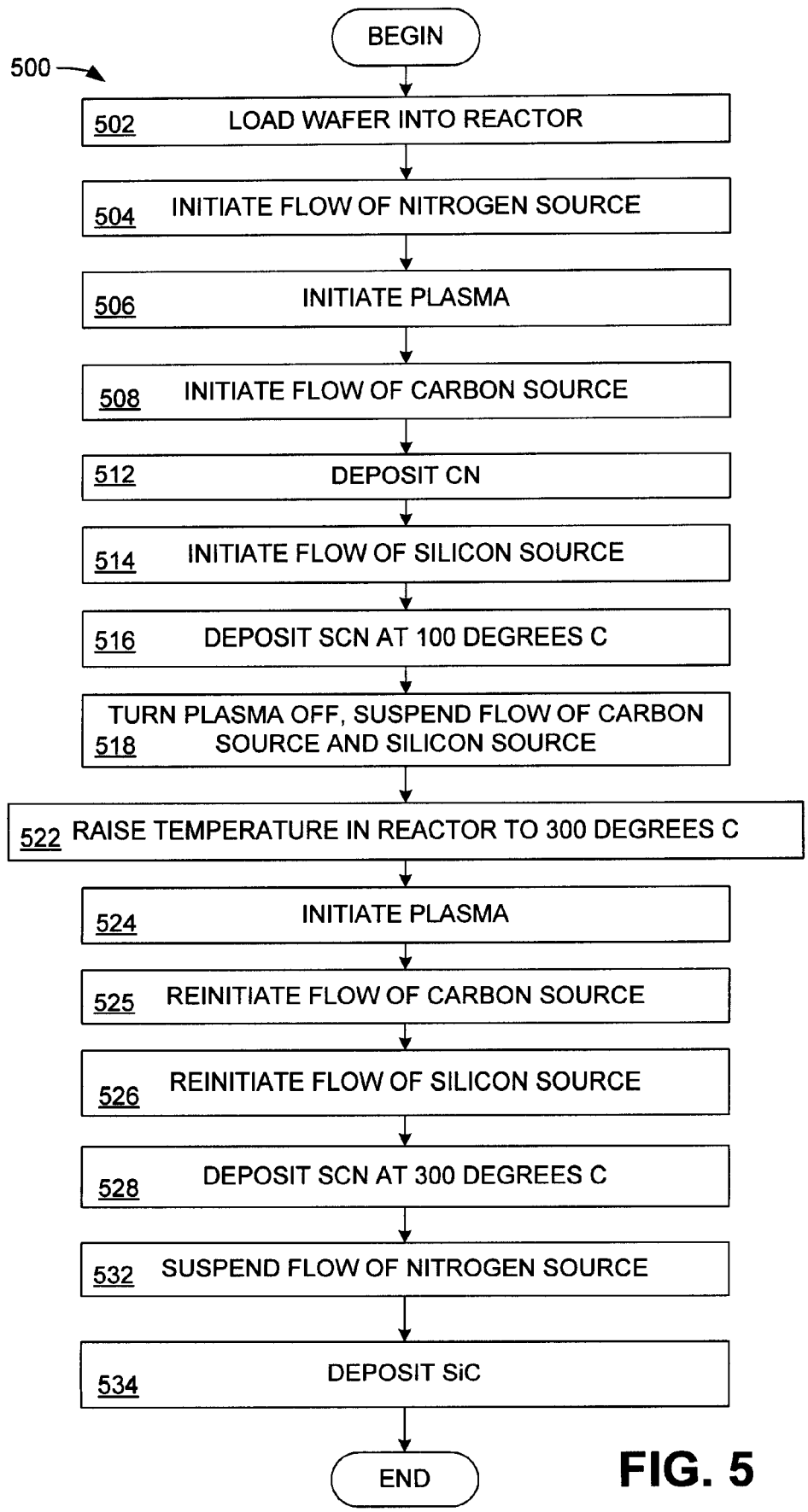
FIG. 5 is a flow chart illustrating an exemplary method for forming the passivation layer in accordance with the invention.

FIG. 5 is a flow chart illustrating an exemplary method for forming the passivation film 120 of the invention. In block 502, a wafer 228 is loaded into the PECVD reactor 202 at an approximate temperature of 100 degrees Celsius so that no surface defects are created by the loading process. In block 504, flow of the nitrogen source 204 (nitrogen gas) is initiated and stabilized at a flow rate appropriate for the deposition system. In this example, the flow rate is approximately 2000 sccm for approximately 15 seconds to 3 minutes. In block 506, the RF plasma field 220 is energized creating a nitrogen plasma. After a time period $t_1$, the flow of the carbon source 206 (methane) is initiated and ramped from 0 sccm to a flow rate of approximately 210 sccm as shown in block 508. In block 512, the deposition of carbon nitrogen material begins to occur over the surface of the wafer 228. In block 514, and corresponding approximately to time $t_2$ of FIG. 3, the flow of the silicon source 210 (silane) is initiated and ramped from 0 sccm to an approximate flow rate of 105 sccm. In block 516, silicon carbon nitrogen (SCN) is deposited at approximately 100 degrees Celsius.

In block 518, the plasma is turned off and the flows of the carbon source 208 and the silicon source 210 are suspended. In block 522, the temperature of the PECVD reactor 202 is raised to approximately 300 degrees Celsius while the nitrogen continues flowing and the wafer remains in the chamber. In block 524 the plasma is reinitiated. In block 525, the flow of the carbon source 208 is reinitiated as described in block 508. In block 526, the flow of the silicon source 210 is reinitiated as described in block 514.

In block 528, a densified layer of silicon carbon nitrogen (SCN) is deposited at approximately 300 degrees Celsius. Optionally, in block 532, the flow of the nitrogen source 206 is suspended, while maintaining the flow of the carbon source 208 and the silicon source 210, to form a layer of silicon carbide in block 534 as described above with respect to FIG. 3.

This disclosure describes the invention in detail using illustrative embodiments. However, it is to be understood that the invention defined by the appended claims is not limited to the precise embodiments described.

The invention claimed is:

1. A method of forming a multiple layer passivation film on a semiconductor device surface, comprising:
   placing a semiconductor device in a deposition reactor;
   introducing a nitrogen source into the reactor;
   introducing a carbon source into the reactor;
   depositing an interfacial layer on a surface of the semiconductor device, the interfacial layer comprising carbon and nitrogen and being substantially devoid of silicon;
   introducing an additional source into the reactor after the interfacial layer has been deposited on the surface of the semiconductor device; and
   depositing an environmentally robust cover layer on the interfacial layer, wherein the additional source is a silicon source, and wherein the cover layer comprises silicon, carbon, and nitrogen.

2. The method of claim 1, wherein the silicon source is introduced at least 15 seconds after the interfacial layer has been depositing.

3. The method of claim 2, wherein the source of the nitrogen is chosen from nitrogen gas and ammonia, the source of the carbon is chosen from methane, ethane, butane, propane, and a liquid hydrocarbon source used in a bubbler with nitrogen (N2) as a carrier gas, and the source of the silicon is chosen from silane and Tretra-Ethyl-OrthoSilicate (TEOS).

4. The method of claim 2, wherein the source of the carbon is chosen from contamination from a wall of the chemical vapor deposition reactor chamber walls and the semiconductor device surface.

5. The method of claim 2, wherein the nitrogen source and the carbon source form reactive species to form the interfacial layer of carbon nitrogen on the semiconductor device surface before the silicon source is introduced.

6. The method of claim 5, wherein the nitrogen source, the carbon source, and the silicon source form reactive species to form the cover layer of silicon, carbon, and nitrogen over the semiconductor device surface.

7. The method of claim 6, wherein the nitrogen source is introduced at a flow rate of about 2000 standard cubic centimeters per minute (sccm), the carbon source is introduced at a flow rate of about 210 sccm and the silicon source is introduced at a flow rate of about 105 sccm.

8. The method of claim 7, further comprising suspending the flow of the nitrogen source after a predetermined amount of time to form an additional layer over the cover layer.

9. The method of claim 6, wherein a first part of the cover layer of silicon carbon nitrogen is formed at a temperature of approximately 100 degrees Celsius and radio frequency (RF) reactor power of approximately 10 W.

10. The method of claim 9, wherein after the interfacial layer and first part of the cover layer have been grown at 100 degrees Celsius and allowed to stabilize, then depositing a densified layer of silicon carbon nitrogen at approximately 300 degrees Celsius.

11. The method of claim 10, wherein the cover layer of silicon, carbon, and nitrogen and the additional layer are formed using a plasma enhanced chemical vapor deposition (PECVD) reactor.

12. The method of claim 6, wherein the introduction of the carbon source prior to the introduction of the silicon source when forming the interfacial layer prevents reactive species released from the silicon source from causing defects in the semiconductor device surface.

13. The method of claim 1, wherein the semiconductor surface is chosen from silicon, germanium, gallium arsenide, indium phosphide, aluminum nitride, indium antimony and combinations thereof.

14. A method of forming a multiple layer passivation film on a semiconductor device surface, comprising:
   placing a semiconductor device in a deposition reactor;
   introducing a nitrogen source into the reactor;
   introducing a carbon source into the reactor;
   depositing a layer of carbon nitrogen (CN) on the semiconductor device surface;
   introducing an additional source into the reactor after the carbon source; and
   depositing an environmentally robust cover layer on the carbon nitrogen layer, wherein the additional source is a silicon source and the cover layer is silicon carbon nitrogen (SCN), wherein the silicon source is introduced after the carbon source has been depositing for a predetermined amount of time, and wherein the predetermined amount of time is approximately between 15 seconds and 3 minutes.

15. A method of forming a multiple layer passivation film for a semiconductor, comprising:
   placing a semiconductor photodetector in a chemical vapor deposition reactor;
   introducing a nitrogen source into the reactor;
   introducing a carbon source into the reactor;
   depositing a layer of carbon nitrogen;
   introducing a silicon source into the reactor after the carbon source; and
   depositing a layer of silicon carbon nitrogen, wherein the silicon source is introduced after the carbon source has been flowing for a predetermined amount of time, and wherein the nitrogen source, the carbon source and the silicon source form reactive species of nitrogen, carbon and silicon, respectively, and form an interfacial layer of carbon nitrogen over the semiconductor prior to forming a cover layer of silicon carbon nitrogen over the interfacial layer, and wherein the nitrogen source is introduced at a flow rate of about 2000 standard cubic centimeters per minute Csccm), the carbon source is introduced at a flow rate of about 210 sccm and the silicon source is introduced at a flow rate of about 105 sccm.

16. The method of claim 15, wherein the cover layer of silicon carbon nitrogen is formed at a temperature of approximately 100 degrees Celsius and wherein after the interfacial layer and cover layer are grown at approximately 100 degrees Celsius and allowed to stabilize, the method further comprising depositing a densified layer of silicon carbon nitrogen at approximately 300 degrees Celsius.

17. The method of claim 16, further comprising suspending the flow of the nitrogen source after a predetermined amount of time to form an additional layer of silicon carbide over the cover layer of silicon carbon nitrogen.

18. A method, comprising:
   (a) contacting, in the substantial absence of silicon, a semiconductor device with carbon and nitrogen to deposit a carbon- and nitrogen-containing interfacial layer on a surface of the semiconductor device; and
   (b) after deposition of the interfacial layer, contacting the semiconductor device with silicon to form a cover layer on the interfacial layer, the cover layer comprising silicon, carbon, and nitrogen.

19. The method of claim 18, wherein, in the contacting (b), the semiconductor device is also contacted with carbon and nitrogen, wherein the cover layer comprises silicon, carbon, an nitrogen, and wherein the contacting steps (a) and (b) are performed in the presence of a plasma.

20. The method of claim 18, wherein the thereafter contacting step is performed at a first temperature and further comprising:
   (c) after contacting step (b), increasing a temperature of the semiconductor device at a second temperature higher than the first temperature;
   (d) contacting the semiconductor device with nitrogen and carbon in the presence of a plasma and in the substantial absence of silicon to form a carbon- and nitrogen-containing layer; and
   (e) contacting the semiconductor device with carbon and silicon in the presence of a plasma and in the substantial absence of nitrogen to form a carbon- and silicon-containing layer.

* * * * *